(12) United States Patent
Matsushita et al.

(10) Patent No.: US 11,418,094 B2
(45) Date of Patent: Aug. 16, 2022

(54) ELECTRIC TOOL

(71) Applicant: KOKI HOLDINGS CO., LTD., Tokyo (JP)

(72) Inventors: Akira Matsushita, Hitachinaka (JP); Tomomasa Nishikawa, Hitachinaka (JP); Yuta Noguchi, Hitachinaka (JP); Takahiro Hirai, Hitachinaka (JP)

(73) Assignee: KOKI HOLDINGS CO., LTD., Tokyo (JP)

( * ) Notice: Subject to any disclaimer, the term of this patent is extended or adjusted under 35 U.S.C. 154(b) by 174 days.

(21) Appl. No.: 16/499,748

(22) PCT Filed: Feb. 23, 2018

(86) PCT No.: PCT/JP2018/006763
§ 371 (c)(1),
(2) Date: Sep. 30, 2019

(87) PCT Pub. No.: WO2018/180085
PCT Pub. Date: Oct. 4, 2018

(65) Prior Publication Data
US 2020/0052559 A1    Feb. 13, 2020

(30) Foreign Application Priority Data

Mar. 31, 2017    (JP) .............................. JP2017-072605

(51) Int. Cl.
*H02K 11/33*    (2016.01)
*H02K 11/215*    (2016.01)
(Continued)

(52) U.S. Cl.
CPC .............. *H02K 11/33* (2016.01); *B25F 5/008* (2013.01); *H02K 7/145* (2013.01); *H02K 9/06* (2013.01);
(Continued)

(58) Field of Classification Search
CPC ...... H02K 11/33; H02K 11/215; H02K 21/16; H02K 7/14; H02K 9/06; H02K 11/00;
(Continued)

(56) References Cited

U.S. PATENT DOCUMENTS 6,488,475 B2 *  12/2002  Murata ................. F04D 25/082
                                                           417/32
7,064,462 B2 *   6/2006  Hempe .................. B23D 45/16
                                                          173/217

(Continued)

FOREIGN PATENT DOCUMENTS

CN          203792295 U      8/2014
JP          2002021794 A     1/2002
(Continued)

OTHER PUBLICATIONS

International Search Report and Written Opinion dated Apr. 17, 2018 by the International Searching Authority (Japan Patent Office) in PCT Application PCT/JP2018/006763 (English Translation of the ISR).

(Continued)

*Primary Examiner* — Quyen P Leung
*Assistant Examiner* — Leda T Pham
(74) *Attorney, Agent, or Firm* — NovoTechIP International PLLC

(57) ABSTRACT

Providing an electric tool with excellent cooling efficiency. An electric tool includes: a housing 2; a motor 3; a fan 34; a sensing portion 41; a switching portion 42; and a circuit board 40. The motor 3 is accommodated in the housing 2. The motor 3 includes a stator 33, a rotor 32, and a rotating shaft 31. The rotor 32 is rotatable relative to the stator 33. The rotating shaft 31 is rotatable together with the rotor 32. The fan 34 is configured to generate a cooling air flow inside the housing 2. The sensing portion 41 is configured to detect (Continued)

a rotated position of the rotor 32. The switching portion 41 controls a rotation of the rotor 32. The sensing portion 41 and the switching portion 42 are mounted on the circuit board 40. The stator 33, the fan 34, the sensing portion 41, the switching portion 42, and the circuit board 40 are arranged in the housing 2 along an axial direction of the rotor 32 in the order of the fan 34, the sensing portion 41, the circuit board 40, the switching portion 42, and the stator 33.

11 Claims, 12 Drawing Sheets

(51) Int. Cl.
    *B25F 5/00*      (2006.01)
    *H02K 7/14*      (2006.01)
    *H02K 9/06*      (2006.01)
    *H02K 21/16*      (2006.01)
    *H05K 1/02*      (2006.01)
    *H05K 1/18*      (2006.01)
    *H05K 7/20*      (2006.01)
    *B25D 17/20*      (2006.01)

(52) U.S. Cl.
    CPC .......... *H02K 11/215* (2016.01); *H02K 21/16* (2013.01); *H05K 1/0203* (2013.01); *H05K 1/181* (2013.01); *H05K 7/20909* (2013.01); *B25D 17/20* (2013.01); *B25D 2217/0061* (2013.01); *B25D 2250/265* (2013.01); *H02K 2211/03* (2013.01); *H05K 2201/09027* (2013.01); *H05K 2201/10151* (2013.01); *H05K 2201/10166* (2013.01)

(58) Field of Classification Search
    CPC ... H02K 3/28; H02K 3/38; B25F 5/00; H05K 1/02; H05K 1/18; H05K 7/20
    See application file for complete search history.

(56) References Cited

U.S. PATENT DOCUMENTS

| | | | | |
|---|---|---|---|---|
| 8,513,838 | B2* | 8/2013 | Toukairin | H02K 11/33 310/50 |
| 10,348,159 | B2* | 7/2019 | Beyerl | H02K 29/08 |
| 2004/0017119 | A1 | 1/2004 | Yamamoto et al. | |
| 2011/0227430 | A1 | 9/2011 | Omori et al. | |
| 2013/0313925 | A1* | 11/2013 | Mergener | H02K 11/33 310/50 |
| 2014/0354087 | A1* | 12/2014 | Kato | H02K 5/02 310/43 |
| 2015/0041167 | A1 | 2/2015 | Yamaguchi et al. | |
| 2015/0364972 | A1* | 12/2015 | Ito | B25F 5/00 310/50 |
| 2016/0229045 | A1 | 8/2016 | Hashimoto et al. | |
| 2016/0336838 | A1 | 11/2016 | Kouda et al. | |
| 2017/0246735 | A1 | 8/2017 | Hashimoto et al. | |

FOREIGN PATENT DOCUMENTS

| | | |
|---|---|---|
| JP | 2002-112504 A | 4/2002 |
| JP | 2009-285789 A | 12/2009 |
| JP | 2013208059 A | 10/2013 |
| JP | 2014-097570 A | 5/2014 |
| JP | 2014-200884 A | 10/2014 |
| WO | 2009/145205 A1 | 12/2009 |
| WO | 2016031719 A1 | 3/2016 |
| WO | 2016/067810 A | 5/2016 |
| WO | 2016/067810 A1 | 5/2016 |

OTHER PUBLICATIONS

Supplementary European Search Report and Written Opinion dated Oct. 19, 2020 by the European Patent Office in European patent application No. 18776883.3.
Office Action dated Oct. 28, 2019 in corresponding JP 2019-508801 (English Translation Provided).
Office Action dated Feb. 28, 2022 in corresponding Chinese patent application No. 201880018828.6.

* cited by examiner

ELECTRIC TOOL

TECHNICAL FIELD

The present disclosure relates to an electric tool capable of efficiency cooling switching element.

BACKGROUND ART

Electric tools that process workpieces by transmitting the drive force of a motor to a tip tool are well known in the art. One such electric tool known in the art is an electric circular saw that employs a brushless motor and has a control board on which switching elements are mounted for controlling currents supplied to the brushless motor.

Patent Literature 1 describes an example of a hammer drill having a brushless motor accommodated in a motor case, and a control board accommodated in an accommodating chamber provided separately from the motor case. The brushless motor has a stator, and a cooling fan provided on an output shaft of the motor that is rotatable coaxially with the output shaft. Switching elements are mounted on the control board.

CITATION LIST

Patent Literature

[Patent Literature 1] International Publication No. 2016/067810

SUMMARY OF INVENTION

Technical Problem

As described above, the hammer drill disclosed in Patent Literature 1 has switching elements that are accommodated in an accommodating chamber provided separately from the motor case. Consequently, the conventional hammer drill has the potential to have worse cooling efficiency.

Therefore, it is an object of the present invention to provide an electric tool with excellent cooling efficiency.

Solution to Problem

In order to attain the above and other objects, according to one aspect, the present invention provides an electric tool including: a housing; a brushless motor; a fan; a sensing portion; a switching portion; and a circuit board. The brushless motor is accommodated in the housing. The brushless motor includes a stator, a rotor, and a rotating shaft. The rotor is rotatable relative to the stator. The rotating shaft is rotatable together with the rotor. The fan is configured to generate a cooling air flow inside the housing. The sensing portion is configured to detect a rotated position of the rotor. The switching portion controls a rotation of the rotor. The sensing portion and the switching portion are mounted on the circuit board. The stator, the fan, the sensing portion, the switching portion, and the circuit board are arranged in the housing along an axial direction of the rotor in the order of the fan, the sensing portion, the circuit board, the switching portion, and the stator.

With this structure, the circuit board on which the switching portion is mounted is disposed between the fan and the stator in the axial direction of the rotor. That is, by positioning the circuit board near the fan, a large flow of air passes over the switching portion, enabling the switching portion to be cooled efficiently.

In the above-described electric tool, preferably, the switching portion includes a plurality of switching members. The plurality of switching members is arranged in a circumferential direction of the rotating shaft.

With this structure, the brushless motor can be efficiently controlled by using the plurality of switching members. Further, the plurality of switching members can be arranged compactly on the circuit board.

Preferably, the brushless motor further includes six stator coils. The plurality of switching members is six switching members. The six stator coils are arranged alternately with the six switching members every 30 degrees along the circumferential direction of the rotating shaft.

With this structure, since the switching member and the stator coil are prevented from overlapping in the circumferential direction, the switching elements can be cooled sufficiently.

Preferably, the brushless motor further includes a magnet rotatable together with the rotor. The sensing portion has a plurality of magnetic sensors for detecting the magnetic force of the magnet. The sensing portion is configured to detect the rotated position of the rotor by detecting the magnetic force of the magnet.

With this structure, the rotation of the rotor can be detected with a simple configuration by using magnetic force. The sensing portion can accurately detect the rotated position of the rotor.

Preferably, the fan further includes a blade portion rotatable together with the shaft. The blade portion is provided with the magnet.

With this structure, the sensing portion can detect the rotated position of the rotor without increasing the dimension of the sensing portion in the axial direction of the rotor, making it possible to reduce the size of the electric tool in the axial direction of the rotor.

Preferably, the plurality of magnetic sensors is arranged on the circuit board in the circumferential direction of the rotating shaft. At least one of the plurality of magnetic sensors is positioned between adjacent switching members of the plurality of switching members in the circumferential direction.

With this structure, it can suppress that heat generated by the switching elements is transferred to the magnetic sensors via the circuit board.

Preferably, the circuit board includes a resin part having a thermally conductive resin. Each of the plurality of switching members is surface-mounted on the resin part of the circuit board. Each of the plurality of switching members has a length in the axial direction and a length in a radial direction of the rotating shaft. The length in the axial direction is shorter than the length in the radial direction.

With this structure, since the switching members are surface-mounted, the heat generated by the switching members easily transferred to the circuit board, and sufficient cooling effect can be obtained.

Preferably, the circuit board includes a resin part having a thermally conductive resin. Each of the plurality of switching members is surface-mounted on the resin part of the circuit board. Each of the plurality of switching members has a length in the axial direction and a length in a radial direction of the rotating shaft. The length in the axial direction is longer than the length in the radial direction.

With this structure, since the switching member disposed upright to increase an area through which the cooling air flow passes, enabling the switching elements to be cooled more efficiently.

Preferably, the circuit board includes a resin part having a thermally conductive resin. Each of the plurality of switching members is surface-mounted on the resin part of the circuit board and includes a switching element and a heat sink. The switching element and the rotating shaft are disposed at opposite sides of the heat sink with respect to the radial direction of the rotating shaft.

With this structure, the heat sink is located closer to the shaft than the switching element. Hence, the cooling air flow passing through an insertion part of the circuit board through which the shaft is inserted passes the heat sink, the switching element can be efficiently cooled via the heat sink.

Preferably, a contact area between the switching members and the circuit board is within a range of 25-150 mm$^2$.

With this structure, since the switching members are surface-mounted, the heat generated by the switching elements easily transferred to the circuit board, and sufficient cooling effect can be obtained.

Preferably, the housing includes a main body housing and a motor housing. The motor housing accommodates the brushless motor. The motor housing includes a barrel part and a base portion. The barrel part has a cylindrical shape extending in the axial direction. The barrel part has one end portion and another end portion in the axial direction. The one end portion is connected to the main body housing. The base portion is continuous with the another end portion. The circuit board and the base portion are disposed at opposite sides of the stator.

With this structure, even when the motor housing has a cylindrical shape that is formed integrally around the circumferential direction of the shaft, positioning the circuit board on the opposite side of the stator from the base portion can facilitate wiring works of electric wires, thereby facilitating assembly of the electric tool.

Preferably, the circuit board is formed with a through-hole having a circular shape and penetrating in the axial direction. The through-hole has a diameter that is larger than a diameter of the rotor.

With this structure, when the motor housing has a cylindrical shape that is formed integrally around the circumferential direction of the rotating shaft and the circuit board is disposed at the opening of the motor housing, the rotor can be easily passed through the through-hole, thereby facilitating assembly of the electric tool.

Further, with this structure, since the switching member and the stator coil are prevented from overlapping in the circumferential direction, the switching elements can be cooled sufficiently.

Preferably, the fan is a centrifugal fan.

With this structure, sufficient cooling effect can be obtained.

Advantage Effect of Invention

In the electric tool according to the present invention, the switching elements can be sufficiently cooled.

DESCRIPTION OF EMBODIMENTS

A hammer drill 1 will be described while referring to FIGS. 1 through 11 as an example of an electric tool according to an embodiment of the present invention. The hammer drill 1 is an electric power tool used to drill holes in a workpiece (for example, concrete, steel, or wood) or to pulverize the workpiece by adding a striking force.

In the following description, "top," "bottom," "front," and "rear" shown in FIG. 1 define the upward direction, downward direction, forward direction, and rearward direction, respectively. Further, "right" and "left" when viewing the hammer drill 1 from the rear are defined as the rightward direction and leftward direction, respectively. When dimensions, numerals, and the like are referenced in this specification, the values are intended to include not only dimensions and numerals that match these dimensions, numerals, and the like exactly, but also dimensions, numerals, and the like that approximately match (values within a range of manufacturing error, for example).

Similarly, such terms as identical, orthogonal, parallel, matching, and flush are intended to include the meanings approximately identical, approximately orthogonal, approximately parallel, approximately matching, and approximately flush, respectively.

Figure 1:
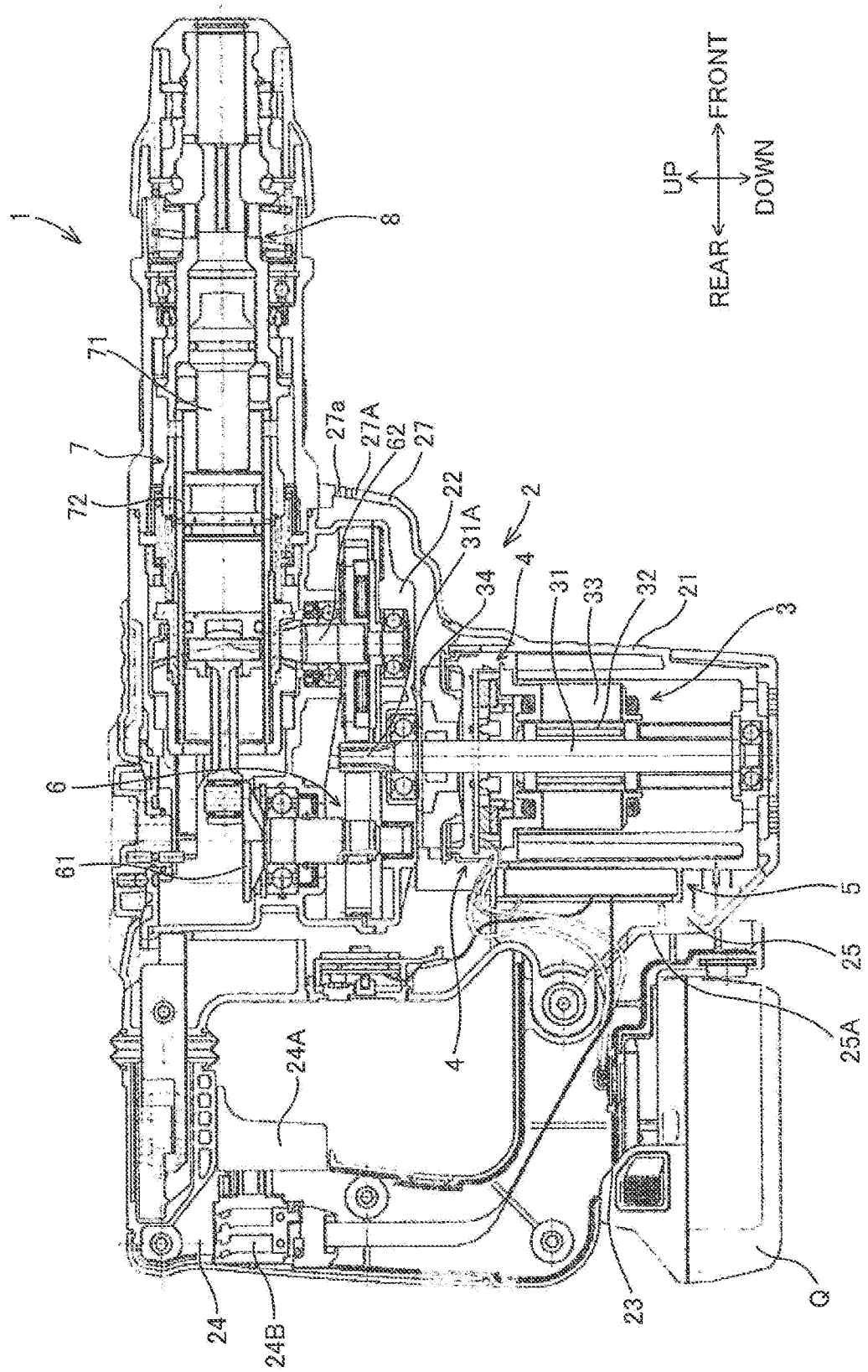
FIG. 1 is a view illustrating an internal structure of a hammer drill according to one embodiment of the present invention.

As shown in FIG. 1, the hammer drill 1 has a housing 2, a motor 3, an inverter circuit board unit 4, a control unit 5, a power transmission unit 6, and output unit 7, and a tool attachment unit 8.

As shown in FIG. 1, the housing 2 forms the outer shell of the hammer drill 1. The housing 2 has a motor accommodating section 21, a gear accommodating section 22, a battery mounting section 23, and a handle section 24.

Figure 2:
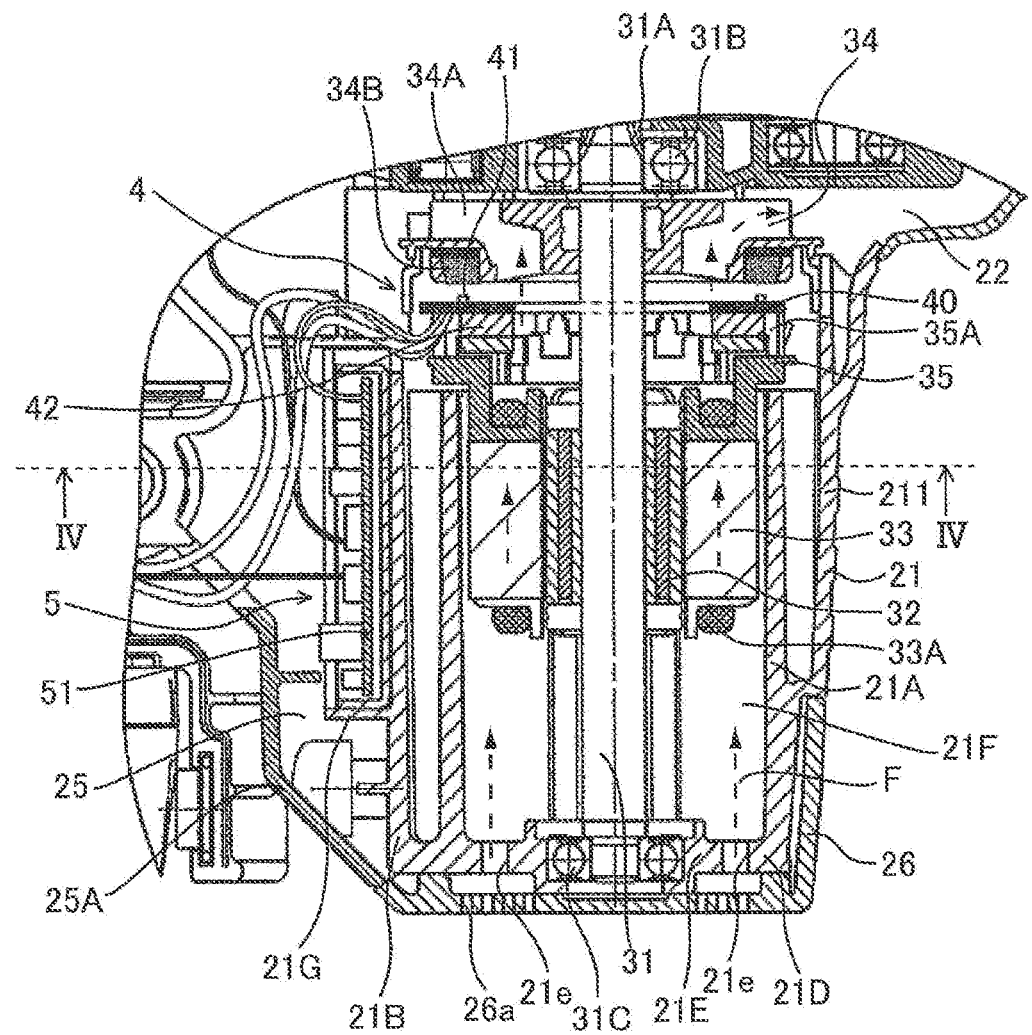
FIG. 2 is an enlarged cross-sectional side view illustrating an internal structure of motor accommodating section of the hammer drill according to the embodiment.
Figure 3:
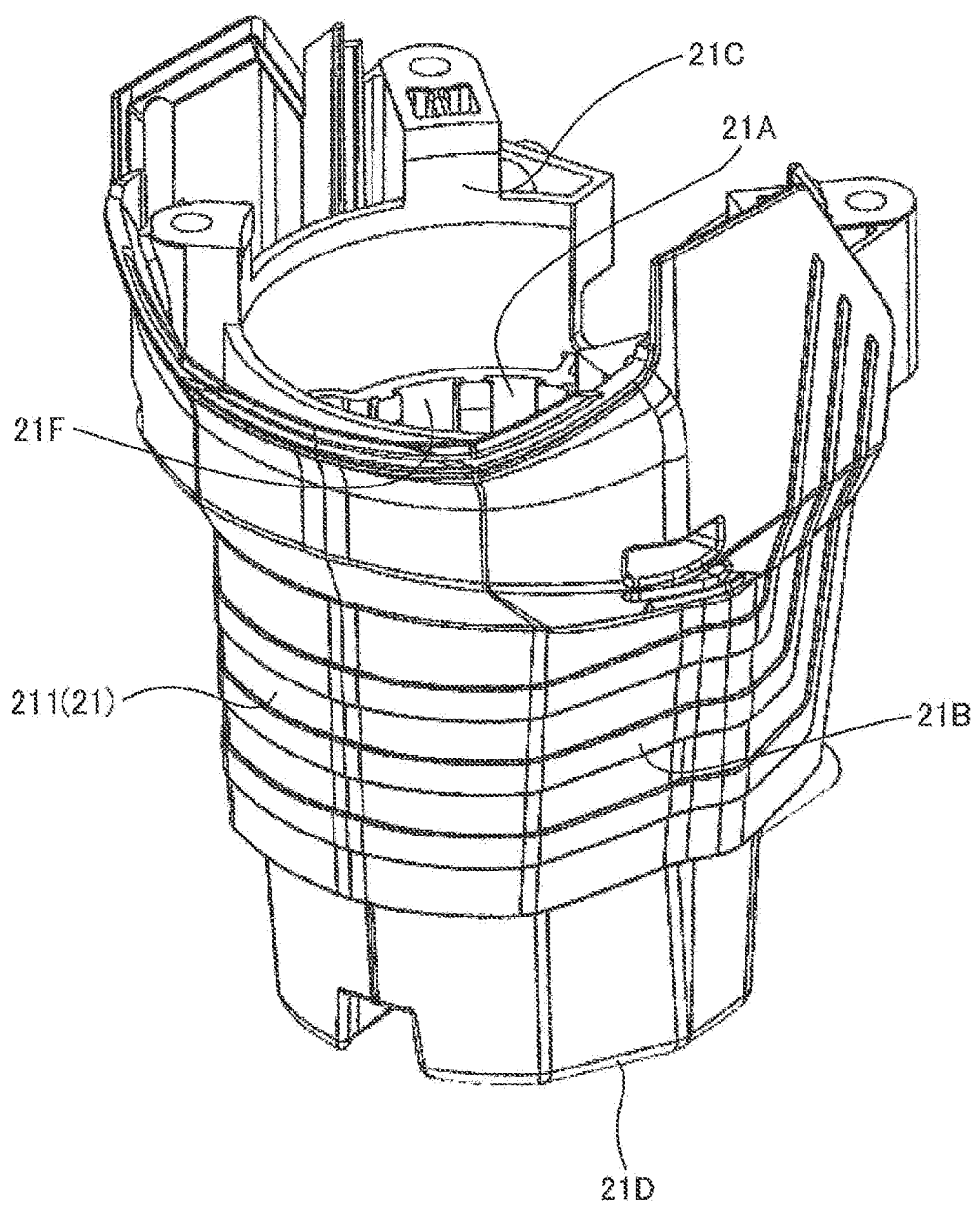
FIG. 3 is a perspective view illustrating an external appearance of the motor accommodating section of the hammer drill according to the embodiment.

As shown in FIGS. 1 through 3, the motor accommodating section 21 has a cylindrical shape that is elongated vertically. The motor accommodating section 21 accommodates the motor 3 and inverter circuit board unit 4. The motor accommodating section 21 has a circumferential wall 211 and a base portion 21D.

As shown in FIGS. 2 and 3, the base portion 21D forms the bottom end of the motor accommodating section 21. Air intake sections 21E are provided in the front and rear parts of the base portion 21D. The air intake sections 21E are formed with pluralities of air intake holes 21c. The air intake holes 21e penetrate the base portion 21D vertically.

The base portion 21D is covered by a bottom cover 26. The bottom cover 26 is formed with pluralities of air intake holes 26a at approximately the same positions in the front-rear and left-right directions as the air intake sections 21E. The bottom cover 26 has a rear edge connected to a cover 25A.

Figure 4:
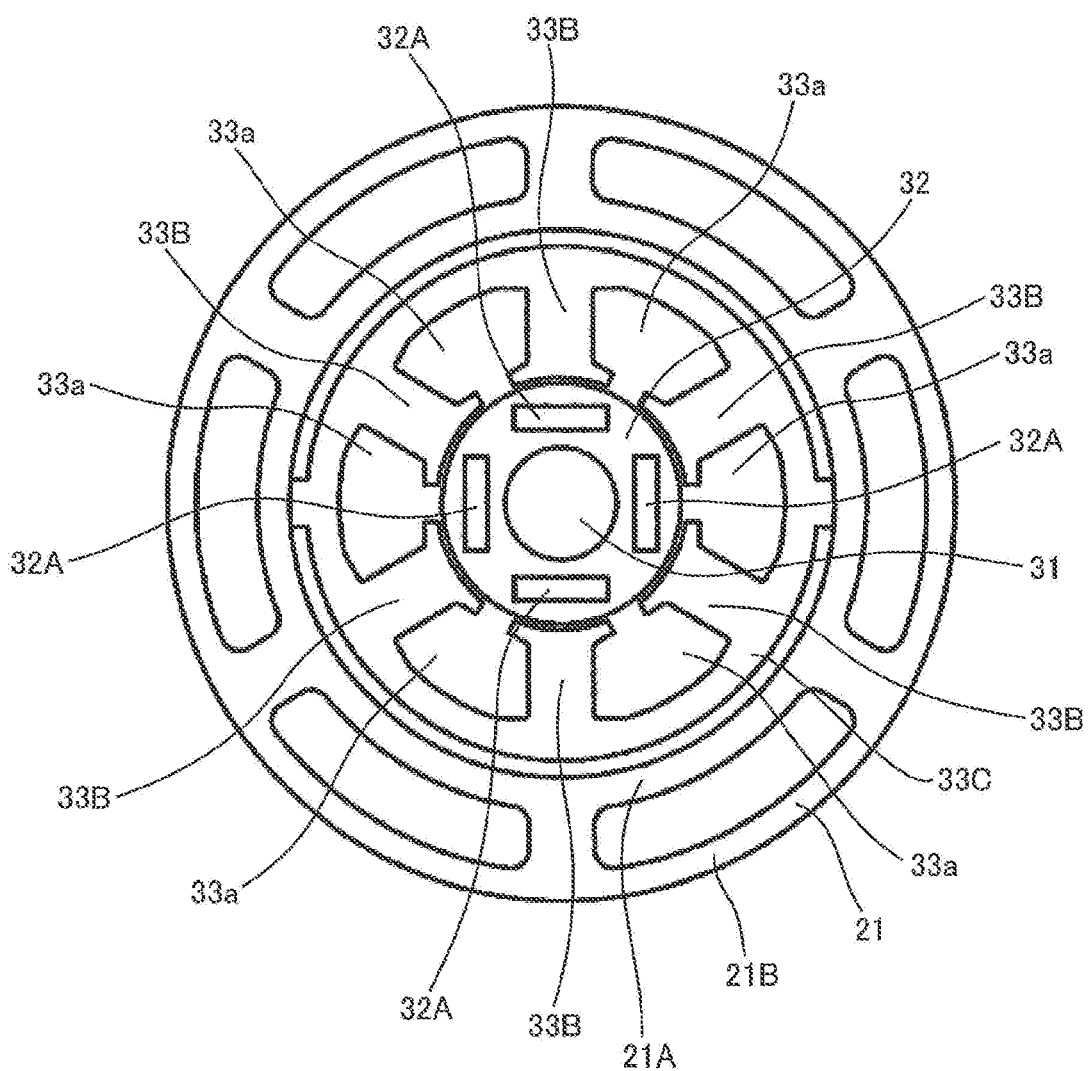
FIG. 4 is a cross-sectional side view taken along the line IV-IV in FIG. 2 illustrating the internal structure of the motor accommodating section of the hammer drill according to the embodiment.

The circumferential wall 211 has a bottom end connected to the base portion 21D and extends upward from the base portion 21D. As shown in FIGS. 2 through 4, the circumferential wall 211 forms a cylindrical shape that is elongated in the vertical direction.

As shown in FIG. 3, the circumferential wall has a top portion provided with a coupling part 21C for connecting the circumferential wall 211 to the gear accommodating section 22. The circumferential wall 211 has an inner circumferential wall 21A, and an outer circumferential wall 21B. The circumferential wall 211 is an example of the "barrel part" in the present invention.

The outer circumferential wall 21B forms the outer shell of the motor accommodating section 21. An accommodating space 25 for accommodating the control unit 5 is defined between the outer surface of the outer circumferential wall 21B and the inner surface of the cover 25A. The circumferential wall 21B has a rear surface provided with a rib 21G protruding rearward from the rear surface of the outer circumferential wall 21B and retaining the control unit 5. The control unit 5 has a flat circuit board 51, and various circuits and the like mounted on the circuit board 51 for controlling the motor 3. The electrical structure of the control unit 5 will be described later.

The inner circumferential wall 21A is provided inside of the outer circumferential wall 21B in radial directions of the circumferential wall 211. A motor accommodating space 21F for accommodating the motor 3 is defined by the inner circumferential surface of the inner circumferential wall 21A.

Returning to FIG. 1, the gear accommodating section 22 is connected to the top end of the motor accommodating section 21 and extends in the front-rear direction. The power transmission unit 6 and output unit 7 are accommodated inside the gear accommodating section 22.

A cover 27 is provided continuously from the top edge on the front portion of the motor accommodating section 21 so as to cover the gear accommodating section 22. The cover 27 is provided with an air outlet section 27A.

The air outlet section 27A has a plurality of air outlet holes 27a. The air outlet holes 127a penetrate the cover 27 in the front-rear direction.

The battery mounting section 23 extends rearward from the rear portion of the motor accommodating section 21 and is configured to be connectable to a battery pack Q. The battery mounting section 23 has a connection terminal section 23A that connects with prescribed terminal parts on the battery pack Q while the battery pack Q is connected to the battery mounting section 23.

The handle section 24 is the part of the hammer drill 1 that the operator grips when working. The handle section 24 is elongated vertically and connects to the rear portion of the gear accommodating section 22 and the top portion on the rear end of the battery mounting section 23. The handle section 24 has a front portion provided with a trigger switch 24A at the top thereof. The operator manipulates the trigger switch 24A. A switch mechanism 24B is provided inside the handle section 24. The switch mechanism 24B is connected to the control unit 5. The switch mechanism 24B outputs an activation signal to the control unit 5 for driving the motor 3 when the trigger switch 24A is pulled, i.e., is operated (for example, when the trigger switch 24A is pushed rearward by the operator's finger) and stops outputting an activation signal when the trigger switch 24A is released, i.e., is stopped (for example, when the operator removes the finger from the trigger switch 24A to halt the pulling operation).

As shown in FIG. 2, the motor 3 is a DC brushless motor and can be driven by power supplied from the battery pack Q mounted in the battery mounting section 23. The motor 3 has a rotating shaft 31, a rotor 32, and a stator 33.

The rotating shaft 31 is rotatably supported in the housing 2 via a bearing 31B and a bearing 31C. The rotating shaft has a top end portion provided with a pinion 31A. The pinion 31A rotates together with the rotating shaft 31.

As shown in FIG. 4, the rotor 32 has four permanent magnets 32A. The rotor 32 is provided on the rotating shaft 31 and is rotatable together with the rotating shaft 31.

As shown in FIG. 2, the stator 33 has stator windings 33A. The stator 33 is fixed in the inner circumferential wall 21A of the motor accommodating section 21. As shown in FIG. 4, the stator 33 has a cylindrical part 33C that is elongated vertically. Protruding parts 33B are provided on the cylindrical part 33C. The protruding parts 33B protrude inward along radial directions of the cylindrical part 33C from the inner circumferential surface of the cylindrical part 33C and are elongated vertically. Six of the protruding parts 33B are provided at substantially equal intervals of 60 degrees along the circumferential direction of the cylindrical part 33C. While not shown in FIG. 4, the stator windings 33A are fixed to the protruding parts 33B. In other words, six of the stator windings 33A are provided at substantially equal intervals of 60 degrees along the circumferential direction of the cylindrical part 33C. The stator windings 33A are disposed so as to oppose each other around the rotor 32. The stator windings 33A are an example of the "stator coils" in the present invention.

As shown in FIG. 2, an insulator 35 is fixed to the top side of the stator 33. By fixing the insulator 35 to the top side of the stator 33, the insulator 35 is fixed in relation to the housing 2. The insulator 35 extends upward from the top side of the stator. A connecting boss 35A is provided on the top portion of the insulator 35.

As shown in FIG. 4, spaces 33a elongated vertically are defined by the outer circumferential surface of the rotor 32, the inner circumferential surface of the cylindrical part 33C, and side surfaces of the protruding parts 33B extending in radial directions of the rotor 32.

As shown in FIG. 2, a fan 34 is fixed to the rotating shaft 31 below the pinion 31A and is rotatable together with the rotating shaft 31. The fan 34 has blade portion 34A, and magnets 34B. By rotating together with the rotating shaft 31, the blade portion 34A generate cooling air in the housing 2. The magnets 34B are mounted on the bottom parts of the blade portion 34A for detecting the rotational position of the rotor 32. The magnets 34B are formed in an annular shape (see FIG. 11). Since the rotating shaft 31 can rotate together with the rotor 32, the magnets 34B can rotate together with the rotor 32 via the rotating shaft 31.

The inverter circuit board unit 4 is provided above the stator 33 of the motor 3. In a plan view, the inverter circuit board unit 4 has a circuit board 40 formed in an annular shape, a magnetic sensing portion 41, and a switching portion 42.

Figure 5:
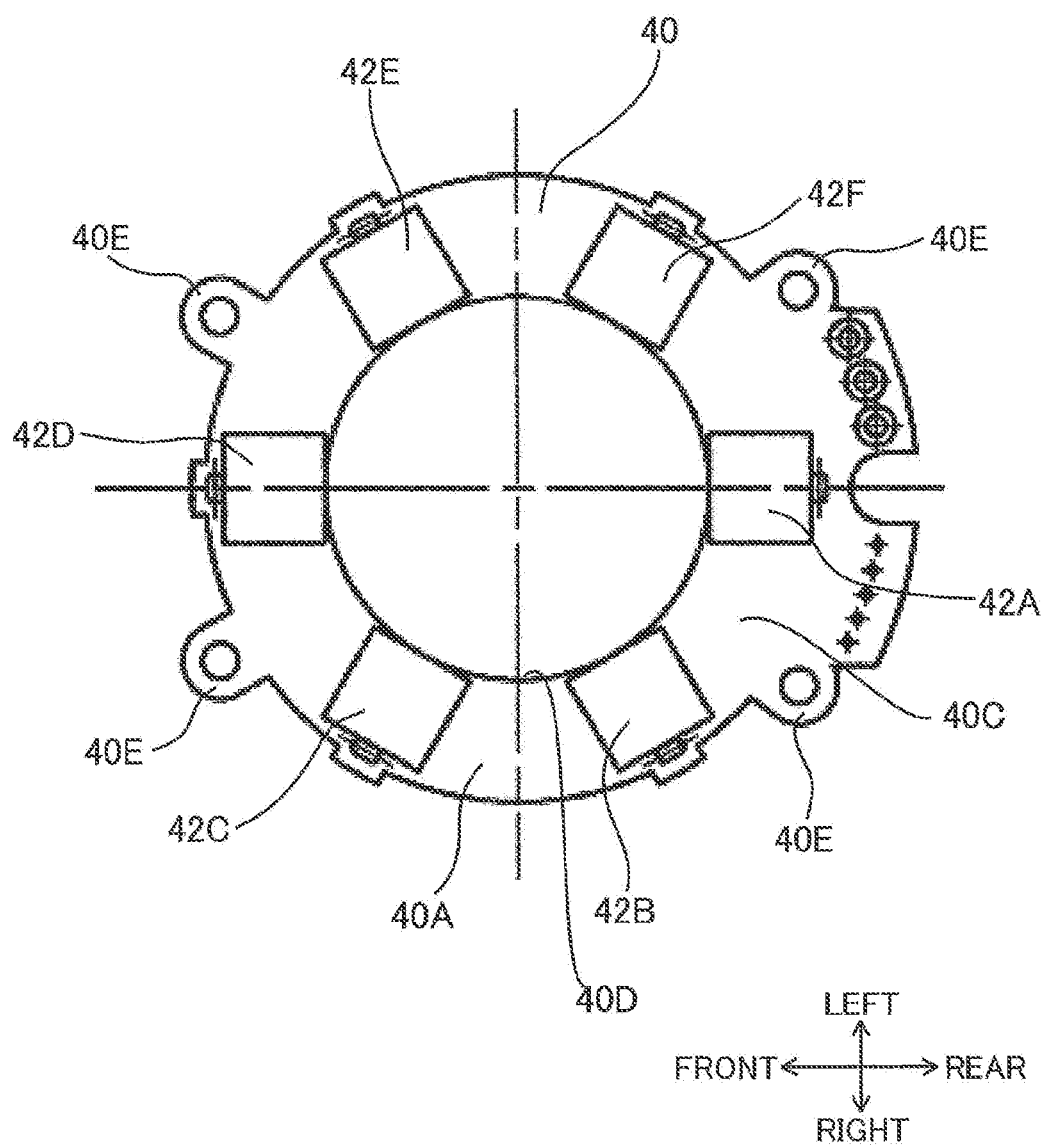
FIG. 5 is a bottom view of an inverter circuit board unit of the hammer drill according to the embodiment.
Figure 6:
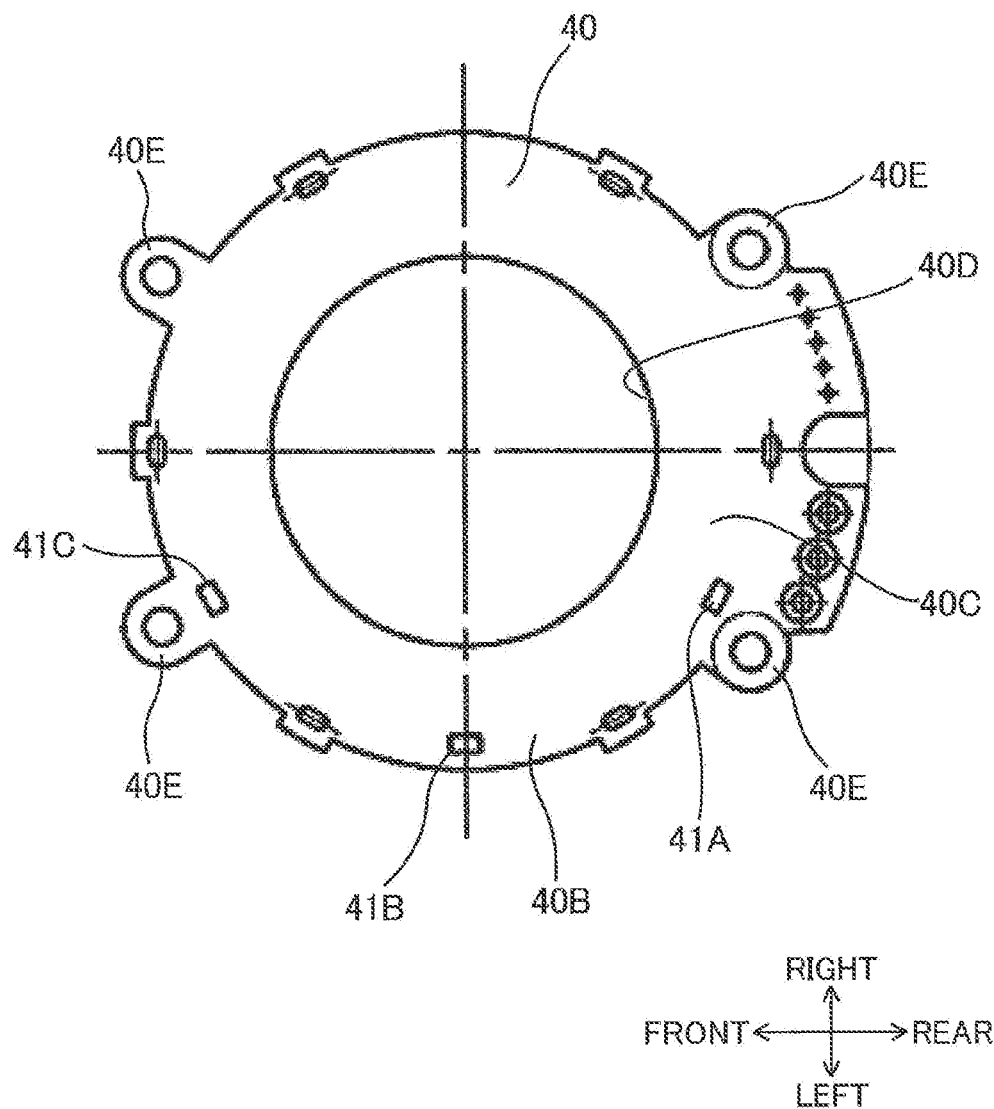
FIG. 6 is a plan view of the inverter circuit board unit of the hammer drill according to the embodiment.

As shown in FIG. 2, the circuit board 40 is positioned on the side of the stator 33 opposite the base portion 21D. As shown in FIGS. 5 and 6, the circuit board 40 has a body part 40C having an annular shape in a plan view. The body part 40C is a circuit board formed of a thermally conductive resin. A first mounting surface 40A is defined on the bottom surface of the body part 40C. The first mounting surface 40A is substantially perpendicular to the vertical direction. A second mounting surface 40B is defined on the top surface of the body part 40C. The second mounting surface 40B is substantially perpendicular to the vertical direction. The circuit board 40 is formed with a through hole 40D at an approximate center region in a plan view. The circuit board 40 (the body part 40C) is provided with connecting edges 40E on a circumferential edge. The circuit board 40 is fixed to the insulator 35 via the connecting edges 40E and the connecting boss 35A of the insulator 35. Note that the circumferential direction of the circuit board 40 substantially matches the circumferential direction of the rotating shaft 31. In the present embodiment, glass epoxy resin is used as the thermally conductive resin. The body part 40C is an example of the "resin part" in the present invention.

The through-hole 40D is formed in a circular shape. The rotating shaft 31 of the motor 3 is inserted through the through-hole 40D. The diameter of the through-hole 40D is set larger than the diameter of the rotor 32. This configuration can facilitate assembly of the hammer drill 1.

More specifically, after the stator 33 and circuit board 40 (the inverter circuit board unit 4) are fixed to the cylindrically shaped motor accommodating section 21, the rotating shaft 31 on which are fixed the rotor 32 and bearing 31C is inserted from above into the through-hole 40D of the circuit board 40, as shown in FIGS. 1 and 2. Since the through-hole 40D is configured with a larger diameter than the rotor 32, the rotating shaft 31 with the rotor 32 and bearing 31C fixed thereto can be inserted easily into the through-hole 40D at this time.

As shown in FIG. 5, the switching portion 42 has six switching members 42A, 42B, 42C, 42D, 42E, and 42F. The switching member 42D is positioned on the front portion of the first mounting surface 40A. The six switching members 42A, 42B, 42C, 42D, 42E, and 42F are arranged on the first mounting surface 40A at substantially equal intervals (approximately 60 degrees each) along the circumferential direction of the rotating shaft 31 (the circuit board 40). The detailed structure of the switching members 42A, 42B, 42C, 42D, 42E, and 42F and the detailed method of mounting these members on the circuit board 40 will be described later.

As shown in FIG. 6, the magnetic sensing portion 41 has three magnetic sensors 41A, 41B, and 41C. The three magnetic sensors 41A, 41B, and 41C are Hall elements, for example. The magnetic sensors 41A, 41B, and 41C are arranged on outer parts of the second mounting surface 40B in radial directions of the circuit board 40. The magnetic sensor 411B is positioned on the right edge of the second mounting surface 40B. The magnetic sensor 41A is disposed at an interval approximately 60 degrees clockwise from the magnetic sensor 41B along the circumferential direction of the rotating shaft 31. Further, the magnetic sensor 41C is arranged at an interval approximately 60 degrees counterclockwise from the magnetic sensor 41B along the circumferential direction of the rotating shaft 31.

In addition, the magnetic sensing portion 41 and switching portion 42 are positioned on opposite sides of the circuit board 40 from each other.

Figure 7:
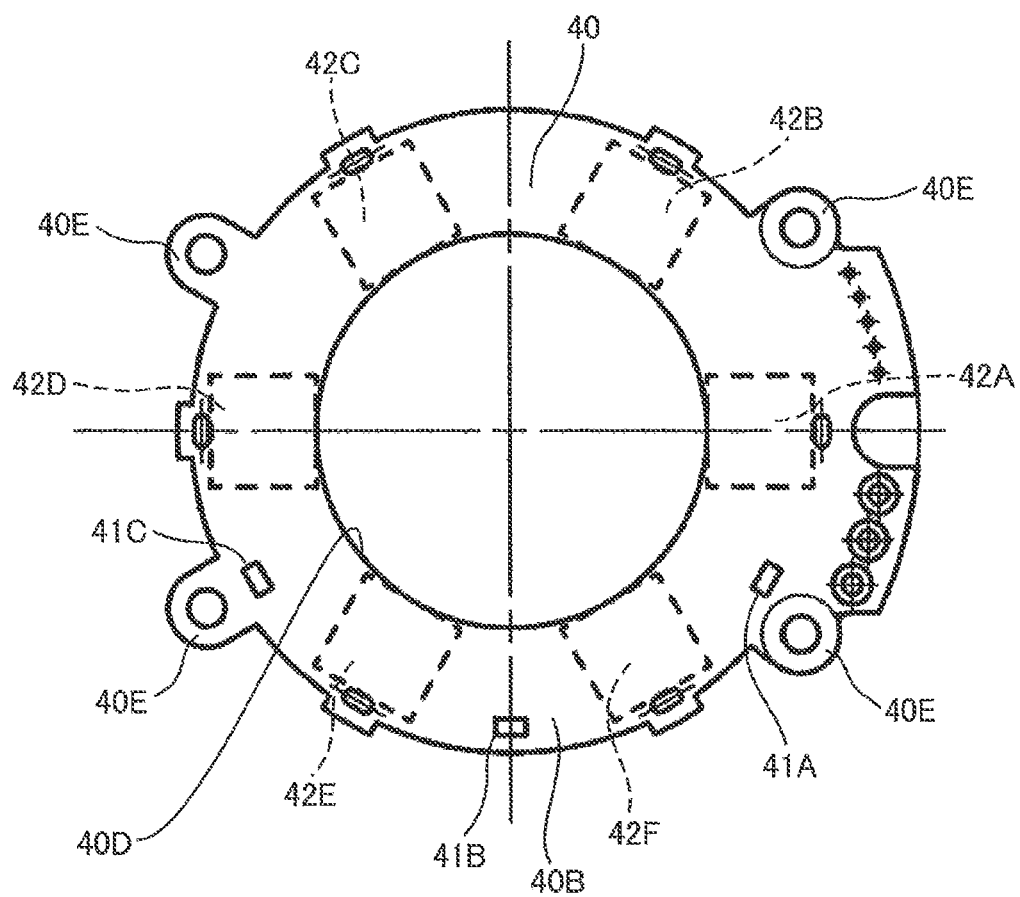
FIG. 7 is a plan view of the inverter circuit board unit of the hammer drill illustrating the positional relationship of the magnetic sensors and the switching members according to the embodiment.

FIG. 7 is a plan view of the inverter circuit board unit 4 illustrating the positional relationships of the three magnetic sensors 41A, 41B, and 41C and the six switching members 42A, 42B, 42C, 42D, 42E, and 42F. As shown in FIG. 7, the magnetic sensor 41A is positioned between the neighboring switching member 42A and switching member 42F in the circumferential direction of the rotating shaft 31 (the circuit board 40). The magnetic sensor 41B is positioned between the neighboring switching member 42F and switching member 42E in the circumferential direction of the rotating shaft 31. The magnetic sensor 41C is positioned between the switching member 42E and switching member 42D in the circumferential direction of the rotating shaft 31. Specifically, beginning from the switching member 42D positioned on the front edge of the circuit board 40, the switching member 42D, magnetic sensor 41C, switching member 42E, magnetic sensor 41B, switching member 42F, magnetic sensor 41A, and switching member 42A are arranged in sequence at intervals of approximately 30 degrees counterclockwise along the circumferential direction of the rotating shaft 31.

Figure 8:
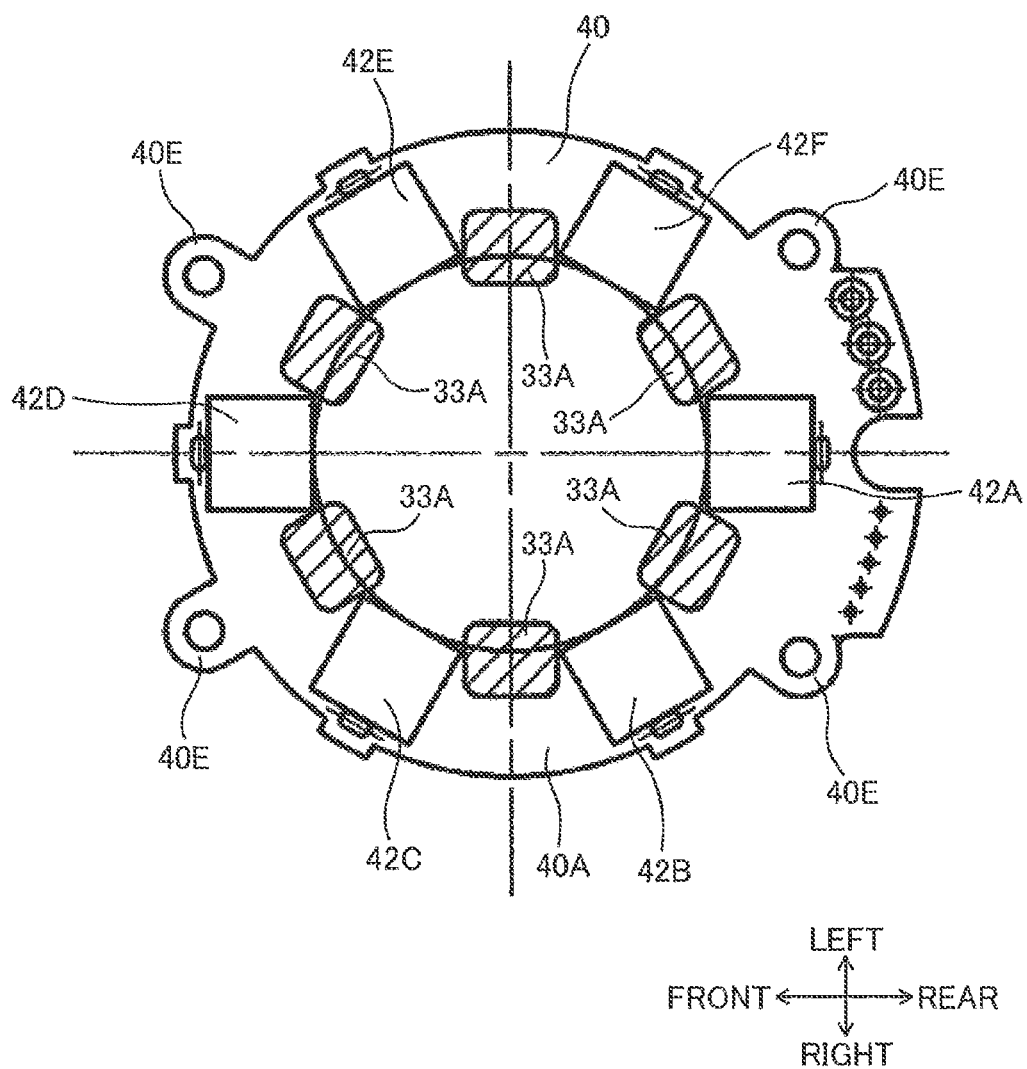
FIG. 8 is a bottom view of the inverter circuit board unit of the hammer drill illustrating the positional relationship of the stator windings and the switching members according to the embodiment.

FIG. 8 is a bottom view of the inverter circuit board unit 4 and illustrates the positional relationships of the stator windings 33A and the six switching members 42A, 42B, 42C, 42D, 42E, and 42F. As shown in FIG. 8, the six stator windings 33A are arranged alternately with the six switching members 42A, 42B, 42C, 42D, 42E, and 42F every 30 degrees along the circumferential direction of the rotating shaft 31.

As shown in FIGS. 1 and 2, the stator 33, fan 34, magnetic sensing portion 41, switching portion 42, and circuit board 40 are arranged in the housing 2 along the axial direction of the rotor 32 in the order of the fan 34, magnetic sensing portion 41, circuit board 40, switching portion 42, and stator 33.

Next, the detailed structures of the switching members 42A, 42B, 42C, 42D, 42E, and 42F and the method of mounting these members on the circuit board 40 will be described.

Figure 9:
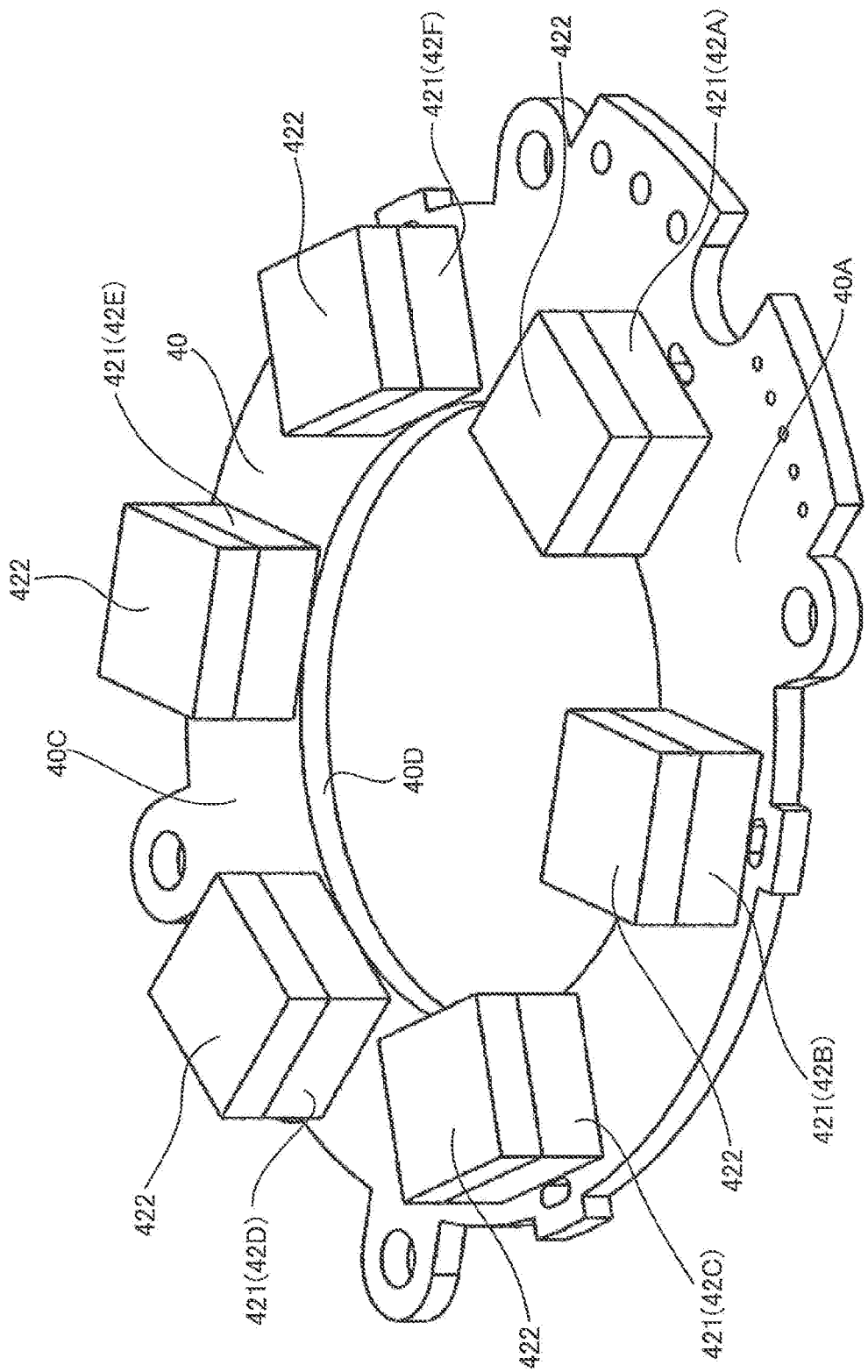
FIG. 9 is a perspective view of the inverter circuit board unit of the hammer drill according to the embodiment.
Figure 10:
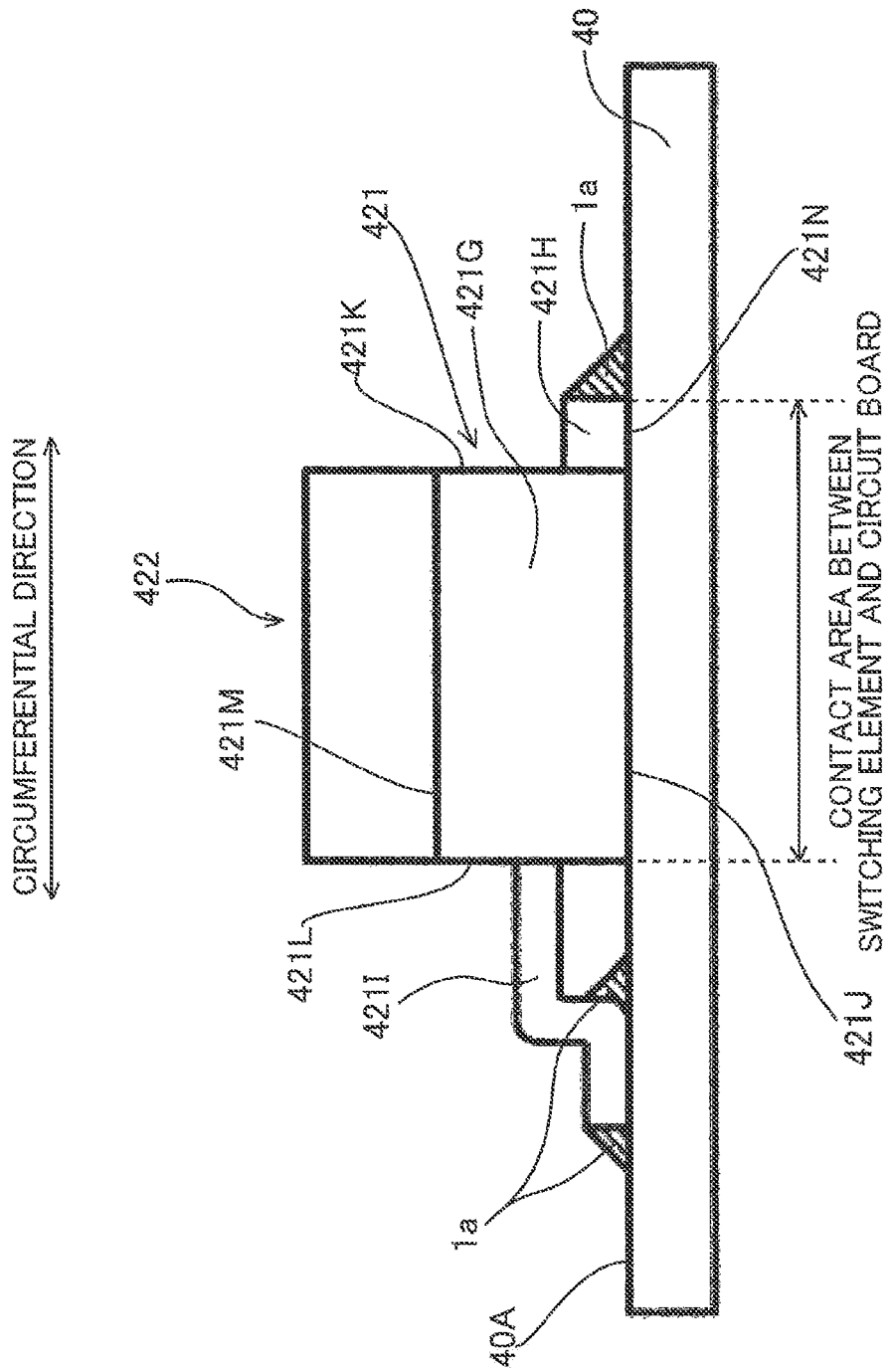
FIG. 10 is a view illustrating a contact aspect between the circuit board and the switching element of the hammer drill according to the embodiment.

As shown in FIGS. 9 and 10, each of the six switching members 42A, 42B, 42C, 42D, 42E, and 42F all have an approximately rectangular parallelepiped shape and are configured to be approximately the same shape as each other. Below, the structure and shape of the six switching members 42A, 42B, 42C, 42D, 42E, and 42F will be described using the switching member 42A as an example. Side surfaces of the switching member 42A that are perpendicular to the vertical direction (the top surface and bottom surface) have a larger area than the other side surfaces. Further, the length of the switching member 42A in the vertical direction is shorter than the length of the switching member 42A in the radial direction of the rotating shaft 31.

The switching member 42A has a switching element 421, and a heat sink 422. The switching element 421 has a rectangular parallelepiped shape, while the heat sink has a planar shape.

As shown in FIG. 10, each switching element 421 also has a substantially rectangular parallelepiped shaped body part 421G, a first terminal part 421H, a second terminal part 421I, and a third terminal part not shown in the drawings. In the present embodiment, the first terminal part 421H is a gate terminal part, the second terminal part 421I is a drain terminal part, and the third terminal part is a source terminal part.

As shown in FIG. 10, the body part 421G is formed in an approximate rectangular parallelepiped shape. The body part 421G has a surface 421M; a surface 421J; and a first endface 421K and second endface 421L facing in the circumferential direction of the rotating shaft 31 (the circuit board 40).

The surface 421M forms the top surface of the switching element 421 and extends substantially orthogonally to the vertical direction. The surface 421M contacts the bottom surface of the heat sink 422. The switching element 421 and heat sink 422 are fixed so as to be immovable relative to each other.

The surface 421J forms the bottom surface of the switching element 421 and extends substantially orthogonally to the vertical direction. The surface 421J is in contact with the first mounting surface 40A of the circuit board 40.

The first endface 421K and second endface 421L facing in the circumferential direction of the rotating shaft 31 extend substantially orthogonally to the circumferential direction.

The first terminal part 421H protrudes in the circumferential direction of the rotating shaft 31 from the bottom of the first endface 421K in the circumferential direction of the body part 421G and extends in a radial direction of the rotating shaft 31 along the first endface 421K. The first terminal part 421H also has a surface 421N. The surface 421N forms the bottom surface of the first terminal part 421H, extends substantially orthogonally to the vertical direction, and is in contact with the first mounting surface 40A of the circuit board 40. The surface 421N is disposed at approximately the same position as the surface 421J of the body part 421G in the vertical direction. That is, the surface 421N and surface 421J are arranged to be substantially flush relative to the vertical.

The second terminal part 421I and the third terminal part are juxtaposed in a radial direction of the rotating shaft 31 and protrude in the circumferential direction of the body part 421G from the approximate vertical center of the second endface 421L. Both the second terminal part 421I and the third terminal part are formed in a crank shape so that their distal ends in the protruding direction contact the first mounting surface 40A of the circuit board 40.

As shown in FIG. 10, the switching element 421 is fixed to the circuit board 40 by soldering the first terminal part 421H, second terminal part 421I, and the third terminal part using solder 1a.

In the present embodiment, the contact area between the surfaces 421J and 421N of the body part 421G and first terminal part 421H (the switching element 421), respectively, and the first mounting surface 40A of the circuit board 40 is 109 mm$^2$, as shown in FIG. 10. Note that the contact area between the switching element 421 and the first mounting surface 40A may be within the range 25-150 mm$^2$. If the contact area is within this range of 25-150 mm$^2$, heat generated by the switching element 421 can be easily transferred to the circuit board 40 to obtain a sufficient cooling effect. The contact area between the surfaces 421J and 421N and the first mounting surface 40A is an example of the "area of contact between the switching member and circuit board" in the present invention.

Returning to FIG. 1, the power transmission unit 6 has a power conversion mechanism 61, and a rotating force transmission mechanism 62. The power transmission unit 6 is configured to convert the rotation of the rotating shaft 31 of the motor 3 into reciprocating motion and transmit the same to the output unit 7.

The output unit 7 is disposed in the gear accommodating section 22 above the rotating force transmission mechanism 62. The output unit 7 has a striker 71, and a cylinder 72.

The striker 71 can be reciprocated by the power conversion mechanism 61. The front end of the striker 71 is configured to contact the rear end of a tip tool mounted in the tool attachment unit 8. The tip tool can be reciprocated along with the reciprocating motion of the striker 71.

The cylinder 72 is configured to be rotatable about its axial center when receiving the rotating force of the motor 3 via the rotating force transmission mechanism 62. Further, the tool attachment unit 8 rotates through the rotation of the cylinder 72 and is configured to rotate the tip tool mounted in the tool attachment unit 8.

Figure 11:
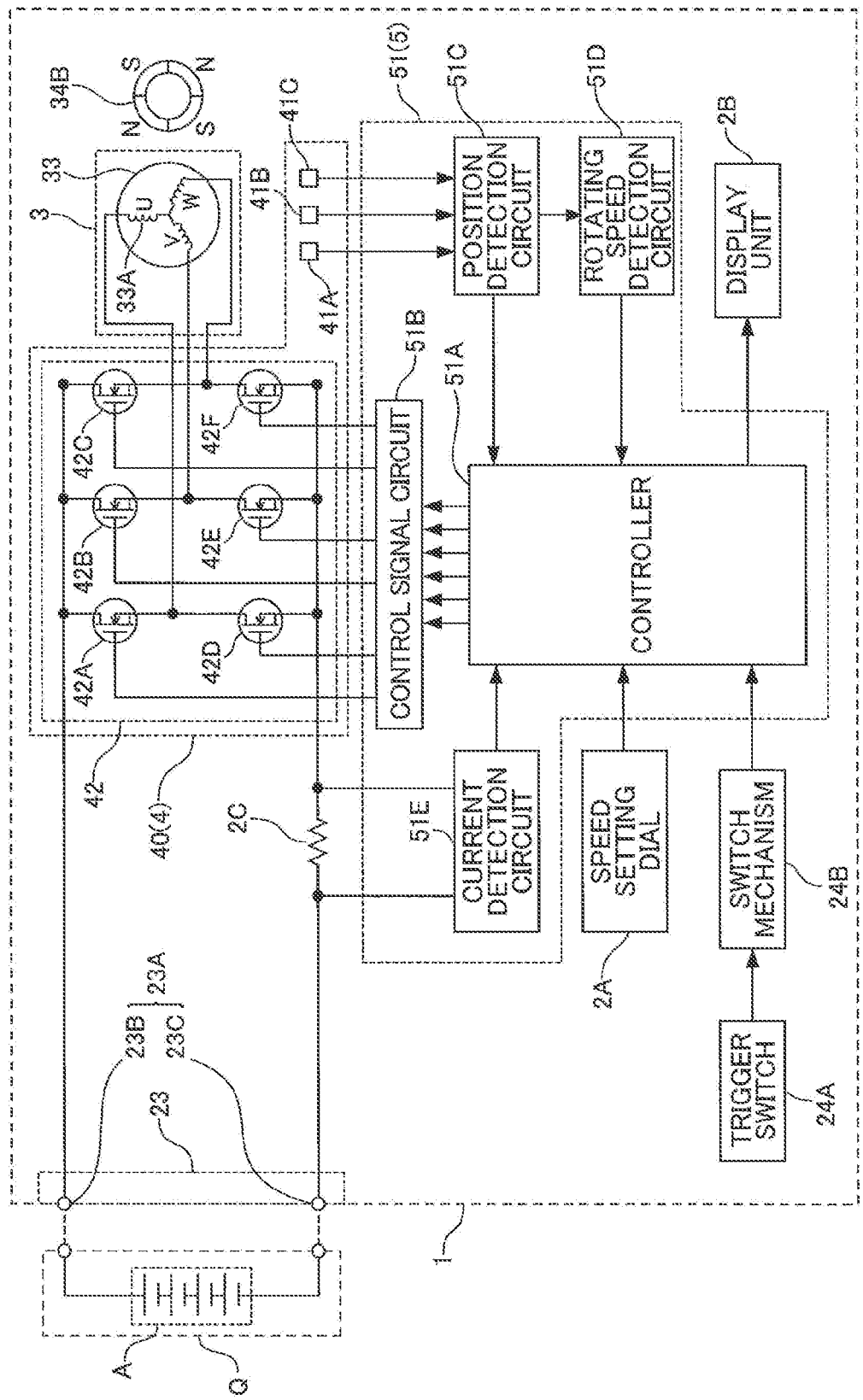
FIG. 11 is a circuit diagram that includes a block diagram illustrating an electrical structure of the hammer drill according to the embodiment.

Next, the electrical structures of the hammer drill 1 and the battery pack Q will be described with reference to FIG. 11.

Figure 12:
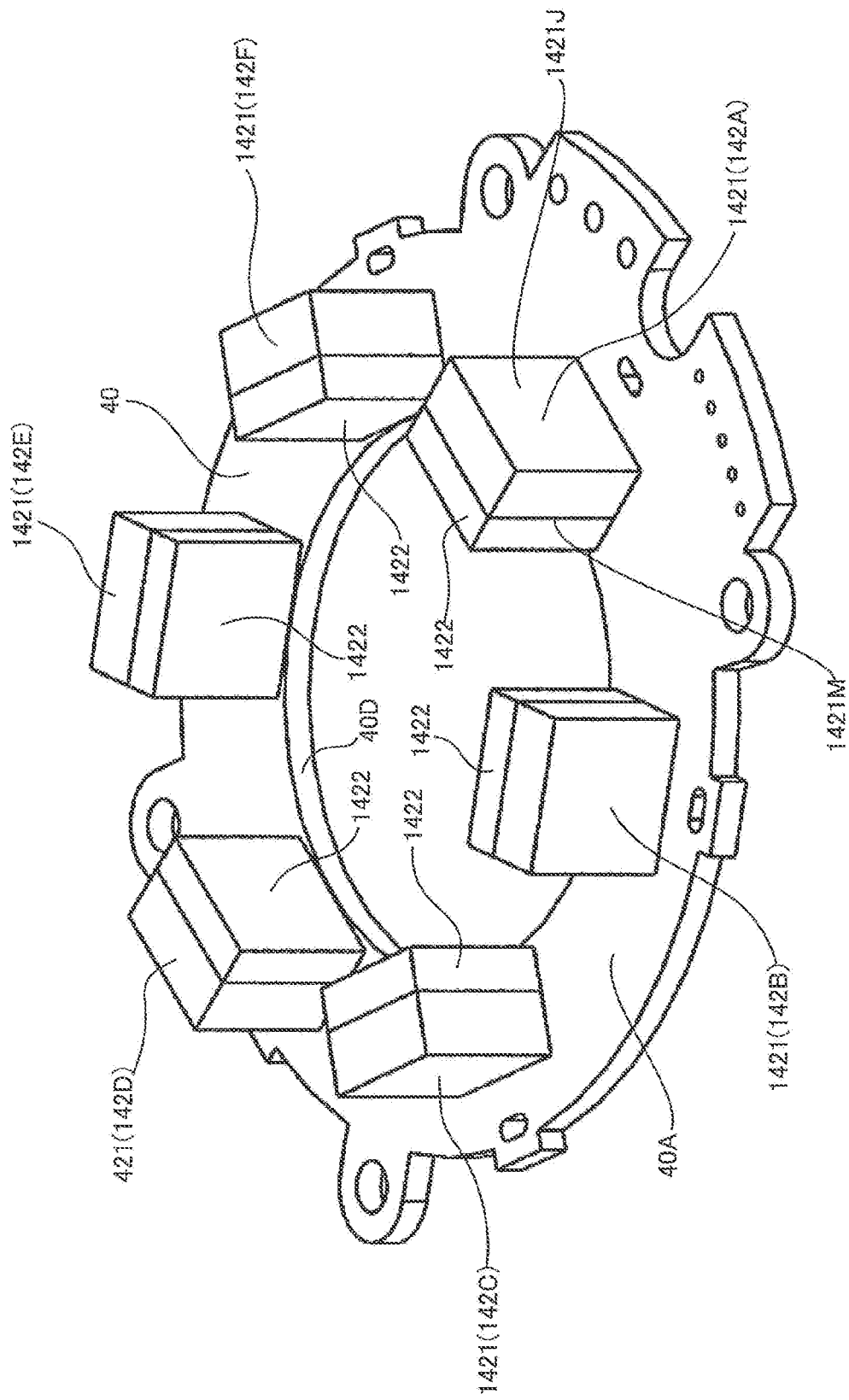
FIG. 12 is a perspective view of the inverter circuit board unit according to a modification to the embodiment of the present invention.

As shown in FIG. 12, the battery pack Q accommodates a plurality of batteries A serving as the power supply for the motor 3, the control unit 5, and the like.

The connection terminal section 23A has a positive connecting terminal 23I, and a negative connecting terminal 23C. When the battery pack Q is mounted in the battery mounting section 23, the positive connecting terminal 23B and negative connecting terminal 23C are each connected to prescribed terminals in the battery pack Q, and the voltage of the battery pack Q is applied across the positive connecting terminal 23B and negative connecting terminal 23C.

The magnets 34B fixed to the bottom ends of the blade portion 34A in the fan 34 have an annular shape and are configured so that a N pole and a S pole appear every 90° along the circumferential direction. The stator windings 33A of the stator 33 include three star-connected phase windings U, V, and W.

The switching portion 42 is an inverter circuit for supplying power from the battery pack Q to the motor 3 and for controlling the rotation of the motor 3. The switching portion 42 is connected between the connection terminal section 23A and the motor 3. The six switching members 42A-42F of the switching portion 42 are connected in a three-phase bridge formation. The gate of each switching member is connected to the control unit 5, while the drain or source of each switching member is connected to one of the windings U, V, and W of the motor 3. The six switching members 42A-42F perform switching operations based on drive signals (gate signals) outputted from the control unit 5 in order to rotate the rotor 32 in a prescribed direction.

On the flat circuit board 51 of the control unit 5 are mounted a controller 51A, a control signal circuit 51B, a rotated position detection circuit 51C, a rotating speed detection circuit 51D, and a current detection circuit 51E.

The current detection circuit 51E detects the electric current flowing in the motor 3 (the motor current) using the value of voltage drop in a shunt resistor 2C disposed between the switching portion 42 and negative connecting terminal 23C and outputs a signal indicating the value of the detected motor current (the current signal) to the controller 51A.

The rotated position detection circuit 51C detects the rotated position of the rotor 32 based on signals outputted from the three magnetic sensors 41A-41C and outputs a signal indicating the detected rotated position (rotated position signal) to the controller 51A and rotating speed detection circuit 51D.

The rotating speed detection circuit 51D detects the rotating speed of the rotor 32 based on the rotated position signals and outputs the detected rotating speed to the controller 51A.

The control signal circuit 511B is connected to the gates of all six switching members 42A-42F and to the controller 51A. The control signal circuit 51B outputs a drive signal to each gate of the switching members 42A-42F based on control signals outputted from the controller 51A.

The controller 51A is provided with an arithmetic logical unit (not shown) having a central processing unit (CPU) for performing arithmetic operations based on a process program and various data used for controlling the motor 3; ROM (not shown) for storing the process program, various data, various threshold values, and the like; and a storage unit having RAM (not shown) for temporarily storing data. The controller 51A controls the motor 3 according to the process program. The controller 51A is a microcomputer in the present embodiment.

As basic control of the motor 3, the controller 51A controls the rotational drive. Rotational drive control involves driving the rotor 32 of the motor 3 to rotate in a prescribed direction and outputting control signals to the control signal circuit SIB. More specifically, the controller 51A forms control signals for alternately switching the switching members (switching elements) conducting electricity among the switching members 42A-42F based on the rotated position signals outputted from the rotated position detection circuit 51C, and outputs these control signals to the control signal circuit 51B. Through these operations, electricity is alternately conducted to prescribed windings among the windings U, V, and W in order to rotate the rotor 32 in a prescribed direction.

Additionally, a speed setting dial 2A and a display unit 2B are provided on the side surface of the housing 2. The speed setting dial 2A can be externally operated by the operator and can output a signal corresponding to the desired speed selected by the operator to the controller 51A. The display unit 2B is configured to display the rotational speed of the motor 3 and the operating mode of the hammer drill 1 based on signals received from the controller 51A.

Next, cooling of the motor 3 and inverter circuit board unit 4 during operations will be described.

When the operator pulls the trigger switch 24A of the handle section 24, the switch mechanism 24B outputs an activation signal to the controller 51A. When an activation signal is outputted, the controller 51A begins drive control for the motor 3 by outputting control signals to the control signal circuit 51B. The control signal circuit 51B outputs drive signals to the gates of all switching members 42A-42F based on the control signals outputted from the controller 51A. The switching members 42A-42F perform switching operations to rotate the rotor 32 in prescribed directions based on the drive signals (gate signals) outputted from the control unit 5. The motor 3 is driven through these operations, and the drive force of the motor 3 is transmitted to the output unit 7 via the power transmission unit 6, causing the tip tool mounted in the tool attachment unit 8 to begin rotating and reciprocating. As the motor 3 is driven, the stator windings 33A of the stator 33 and the switching members 42A-42F controlling the motor 3 generate heat.

As the rotating shaft 31 of the motor 3 rotates in this state, the fan 34 rotates together with the rotating shaft 31, as illustrated in FIG. 2. At this time, external air is drawn into the motor accommodating section 21 (the housing 2) through the air intake holes 21e (the air intake sections 21E), generating cooling air inside the housing 2, as indicated by the arrows F in FIG. 2. The arrows F in FIG. 2 indicate the direction that the cooling air flows.

As indicated by the arrows F, the cooling air moves upward through the motor accommodating space 21F of the motor accommodating section 21 until arriving at the bottom of the stator 33.

Upon reaching the bottom of the stator 33, the cooling air passes over the entire vertical length of the stator 33, traveling upward through the motor accommodating section 21 while cooling the stator 33.

After passing over the stator 33, the cooling air continues to flow upward through the motor accommodating space 21F of the motor accommodating section 21, passing over and cooling the inverter circuit board unit 4 before arriving at the fan 34, as indicated by the arrows F. More specifically, the cooling air passes upward through the through-hole 40D in the circuit board 40 illustrated in FIG. 9, passes over the surfaces of the switching members 42A-42F on the inside with respect to radial directions of the rotating shaft 31 (the circuit board 40), and cools the switching members 42A-42F (the switching elements 421).

As indicated by the arrows F, cooling air that reaches the fan 34 is pushed outward in front and rear directions by the fan 34. At this time, a portion of the cooling air reaches the air outlet holes 27a (the air outlet section 27A) and is discharged from the housing 2 toward the front side (see FIG. 1).

Next, the cooling effect on the switching elements 421 will be described. As described above, the surface 421M forming the top surface of each switching element 421 is in contact with the bottom surface of the corresponding heat sink 422. During control of the motor 3, the switching elements 421 generate heat, causing the temperature of the switching elements 421 to rise. The temperature of the heat sinks 422 is low relative to the switching elements 421. Heat produced from the switching elements 421 is transferred to the cooler heat sinks 422 at this time. Heat transferred from the switching elements 421 to the heat sinks 422 is subsequently released from the heat sinks 422 into the atmosphere. Thus, the switching elements 421 can be cooled efficiently through the heat sinks 422.

Further, the surface 421N that forms the bottom surface of each switching element 421 is in contact with the surface 421N of the first terminal part 421H. During control of the motor 3, the switching elements 421 generate heat, causing the temperature of the switching elements 421 to rise. The temperature of the body part 40C is low relative to the temperature of the switching elements 421. Heat produced from the switching elements 421 is transferred to the relatively cooler body part 40C at this time. Heat transferred from the switching elements 421 to the circuit board 40 is subsequently released from the circuit board 40 into the atmosphere. Thus, the switching elements 421 can be cooled efficiently through the circuit board 40. Further, since the composition of the body part 40C of the circuit board 40 includes a thermally conductive resin, as described above, the switching elements 421 can be cooled more efficiently through the circuit board 40.

As illustrated in FIG. 7, beginning from the switching member 42D positioned on the front end of the circuit board 40, the switching member 42D, magnetic sensor 41C, switching member 42E, magnetic sensor 41B, switching member 42F, magnetic sensor 41A, and switching member 42A are arranged in order at approximately 30° intervals counterclockwise along the circumferential direction of the rotating shaft 31. This arrangement can suppress heat generated by switching elements 421 from being transferred to the magnetic sensors 41A, 41B, and 41C via the circuit board 40.

Further, cooling air passing upward through the through-hole 40D of the circuit board 40 passes over the surfaces of the switching members 42A-42F on the inside with respect to radial directions of the rotating shaft 31 (the circuit board 40), cooling the switching members 42A-42F (the switching elements 421). Hence, the switching elements can be cooled efficiently.

As shown in FIG. 8, the stator windings 33A are arranged alternately with the switching members 42A, 42B, 42C, 42D, 42E, and 42F every 30° along the circumferential direction of the rotating shaft 31. Hence, cooling air flowing along the axial direction of the rotating shaft 31 can smoothly come into contact with the switching members 42A-42F without being blocked by the stator windings 33A. Further, since cooling air whose temperature has risen after passing over the stator windings 33A is suppressed from passing over the switching portion 42 (the switching elements 421), the switching elements 421 can be cooled sufficiently.

As described above, the hammer drill 1 serving as an example of the electric tool according to the present embodiment of the present invention has the housing 2; the motor 3 accommodated in the housing 2 and including the stator 33, the rotor 32 that can rotate relative to the stator 33, and a rotational shaft that can rotate together with the rotor 32; the fan 34 that generates cooling air inside the housing 2; the magnetic sensing portion 41 that can detect the rotated position of the rotor 32; the switching portion 42 for controlling the rotation of the rotor 32; and the circuit board 40 on which the magnetic sensing portion 41 and switching portion 42 are mounted. The stator 33, fan 34, magnetic sensing portion 41, switching portion 42, and circuit board 40 are arranged along the axial direction of the rotor 32 in the order of the fan 34, magnetic sensing portion 41, circuit board 40, switching portion 42, and stator 33. With this arrangement, the circuit board 40 in which the switching portion 42 is disposed is positioned between the fan 34 and stator 33 in the axial direction of the rotor 32. That is, by positioning the circuit board 40 near the fan 34, a large flow of air passes over the switching portion 42, enabling the switching portion 42 (the switching elements 421) to be cooled efficiently.

Further, the fan 34 is rotatable together with the rotating shaft 31 and is provided with the blade portion 34A possessing the magnets 34B. The magnetic sensing portion 41 has the magnetic sensors 41A, 41B, and 41C for detecting the magnetic force of the magnets 34B. By detecting the magnetic force of the magnetic sensors 41A, 41B, and 41C, the magnetic sensing portion 41 can detect the rotated position of the rotor 32. Therefore, the magnetic sensor 41A can detect the rotated position of the rotor 32 without increasing the dimension of the magnetic sensing portion 41 in the axial direction of the rotor 32, making it possible to reduce the size of the hammer drill 1 in the axial direction of the rotor 32.

Further, the motor accommodating section 21 has the circumferential wall 211 formed in a cylindrical shape that extends along the axial direction of the rotor 32 with one end in the axial direction connected to the gear accommodating section 22; and the base portion 21D formed continuously with the other end of the circumferential wall 211 in the axial direction of the rotor 32. Positioning the circuit board 40 on the opposite side of the stator 33 from the base portion 21D can facilitate the arrangement of these components, thereby facilitating assembly of the hammer drill 1.

The through-hole in the circuit board 40 is formed in a circular shape and has a diameter larger than the outer diameter of the rotor. Accordingly, in the present embodiment in which the motor accommodating section 21 has a cylindrical shape that is formed integrally around the circumferential direction of the rotating shaft 31 and the circuit board 40 is disposed at the opening of the motor accommodating section 21, the rotor 32 can be easily passed through the through-hole 40D, thereby facilitating assembly of the hammer drill 1.

The above description of the present embodiment is only an example, and it wound be apparent to those skilled in the art that many modifications may be made therein, including the combinations of components, and that such modifications would fall within the scope of the present invention.

Next, a variation of the present embodiment described above will be described with reference to FIG. 12.

In the variation of the embodiment shown in FIG. 12, six switching members 142A-142F all have a general rectangular parallelepiped shape and are configured with approximately the same shape as each other. The switching members 142A-142F are fixed to the circuit board 40 by soldering while in a state of contact with the first mounting surface 40A of the circuit board 40. Next, the structure and shape of the switching members 142A-142F will be described using the switching member 142A as an example. The sides of the switching member 142A that are perpendicular to radial directions of the rotating shaft 31 (the circuit board 40) are configured to have a larger area than the other side surfaces. Further, the dimension of the switching member in the vertical direction is greater than the dimension of the switching member 42A in the radial direction of the rotating shaft 31.

In the variation of the embodiment shown in FIG. 12, a surface 1421M is positioned on the inner side of a switching element 1421 in the radial direction of the rotating shaft 31 (the circuit board 40), and a surface 1421J is positioned on the outer side of the switching element 1421 in the radial direction. Further, the surface 1421M contacts a heat sink 1422 on the outer side surface in the radial direction of the rotating shaft 31, and the switching element 1421 and heat sink 1422 are fixed to each other so as to be immovable relative to each other. Further, the switching element 1421 is positioned on the opposite side of the heat sink 1422 from the through-hole 40D in the radial direction of the rotating shaft 31.

Next, the cooling effect on the switching elements 1421 will be described. As described above, the inner side surface 1421M of each switching element 1421 contacts the outer side surface of the corresponding heat sink 1422 in the radial direction of the rotating shaft 31. During control of the motor 3, the switching element 1421 generates heat, causing the temperature of the switching element 1421 to rise. The temperature of the heat sink 1422 is low in comparison to the temperature of the switching element 1421. Heat produced from the switching element 1421 is transferred to the relatively cooler heat sink 1422 at this time. Heat transferred from the switching element 1421 to the heat sink 1422 is subsequently released from the heat sink 1422 into the atmosphere. Thus, the switching elements 1421 can be cooled efficiently through the heat sinks 1422.

In the variation shown in FIG. 12, cooling air passes upward through the through-hole 40D of the circuit board 40, passing over and cooling the surfaces of the heat sinks 1422 on the inside in radial directions of the rotating shaft 31. Accordingly, heat can easily escape from the heat sinks, thereby reducing the temperature of the heat sinks. Consequently, heat is more readily transferred from the switching elements 1421 to the heat sinks 1422, enabling the switching elements 1421 to be cooled efficiently.

In the present embodiment, the hammer drill 1 is described as an example of the electric tool. However, the present invention can be applied to other electric tools that are driven by a brushless motor. The present invention is best suited to electric tools having a cylindrical housing, such as impact wrenches, circular saws, and impact drills.

REFERENCE SIGNS LIST

1: hammer drill, 2: housing, 3: motor, 4: inverter circuit board unit, 5: control unit, 6: power transmission unit, 7: output unit, 8: tool attachment unit

The invention claimed is:
1. An electric apparatus comprising:
a housing;
a brushless motor accommodated in the housing, the brushless motor comprising:
a stator;
a rotor rotatable relative to the stator; and
a rotating shaft rotatable together with the rotor;
a fan configured to generate a cooling air flow inside the housing;
a sensing portion configured to detect a rotated position of the rotor;
a switching portion for controlling a rotation of the rotor; and
a circuit board on which the sensing portion and the switching portion are mounted,
wherein the stator, the fan, the sensing portion, the switching portion, and the circuit board are arranged in the housing along an axial direction of the rotor in an order of the fan, the sensing portion, the circuit board, the switching portion, and the stator,
wherein the switching portion comprises a plurality of switching members, the plurality of switching members being arranged in a circumferential direction of the rotating shaft,
wherein the brushless motor further comprises a plurality of stator coils, and
wherein the plurality of stator coils is arranged alternately with the plurality of switching members along the circumferential direction of the rotating shaft.

2. The electric apparatus according to claim 1, wherein the plurality of stator coils is six stator coils,
wherein the plurality of switching members is six switching members, and
wherein the six stator coils are arranged alternately with the six switching members every 30 degrees along the circumferential direction of the rotating shaft.

3. The electric apparatus according to claim 1, wherein the brushless motor further comprises a magnet rotatable together with the rotor, and
wherein the sensing portion has a plurality of magnetic sensors for detecting a magnetic force of the magnet, the sensing portion being configured to detect the rotated position of the rotor by detecting the magnetic force of the magnet.

4. The electric apparatus according to claim 3, wherein the fan further comprises a blade portion rotatable together with the rotating shaft, the blade portion being provided with the magnet.

5. The electric apparatus according to claim 4, wherein a contact area between the switching members and the circuit board is within a range of 25-150 mm$^2$.

6. The electric apparatus according to claim 3, wherein the plurality of magnetic sensors is arranged on the circuit board in the circumferential direction of the rotating shaft, at least one of the plurality of magnetic sensors being positioned between adjacent switching members of the plurality of switching members in the circumferential direction.

7. The electric apparatus according to claim 1, wherein the circuit board comprises a resin part having a thermally conductive resin,
wherein each of the plurality of switching members is surface-mounted on the resin part of the circuit board and comprises a switching element and a heat sink,
wherein the switching element and the rotating shaft are disposed at opposite sides of the heat sink with respect to a radial direction of the rotating shaft.

8. The electric apparatus according to claim 1, wherein the housing comprises a main body housing and a motor housing, the motor housing accommodating the brushless motor, the motor housing comprising:
a barrel part having a cylindrical shape extending in the axial direction, the barrel part having one end portion and another end portion in the axial direction, the one end portion being connected to the main body housing; and
a base portion continuous with the another end portion, and
wherein the circuit board and the base portion are disposed at opposite sides of the stator.

9. The electric apparatus according to claim 1, wherein the fan is a centrifugal fan.

10. An electric apparatus comprising:
a housing;
a brushless motor accommodated in the housing, the brushless motor comprising:
a stator;
a rotor rotatable relative to the stator; and
a rotating shaft rotatable together with the rotor;
a fan configured to generate a cooling air flow inside the housing;
a sensing portion configured to detect a rotated position of the rotor;
a switching portion for controlling a rotation of the rotor; and
a circuit board on which the sensing portion and the switching portion are mounted,
wherein the stator, the fan, the sensing portion, the switching portion, and the circuit board are arranged in the housing along an axial direction of the rotor in an order of the fan, the sensing portion, the circuit board, the switching portion, and the stator,
wherein the switching portion comprises a plurality of switching members, the plurality of switching members being arranged in a circumferential direction of the rotating shaft,
wherein the circuit board comprises a resin part having a thermally conductive resin,
wherein each of the plurality of switching members is surface-mounted on the resin part of the circuit board, and
wherein each of the plurality of switching members has a length in a radial direction of the rotating shaft and a length in the axial direction which is shorter than the length in the radial direction, or wherein each of the plurality of switching members has a length in the radial direction of the rotating shaft and a length in the axial direction which is longer than the length in the radial direction.

11. An electric apparatus comprising:
a housing;
a brushless motor accommodated in the housing, the brushless motor comprising:
a stator;
a rotor rotatable relative to the stator; and
a rotating shaft rotatable together with the rotor;
a fan configured to generate a cooling air flow inside the housing;
a sensing portion configured to detect a rotated position of the rotor;
a switching portion for controlling a rotation of the rotor; and
a circuit board on which the sensing portion and the switching portion are mounted,
wherein the stator, the fan, the sensing portion, the switching portion, and the circuit board are arranged in the housing along an axial direction of the rotor in an order of the fan, the sensing portion, the circuit board, the switching portion, and the stator,
wherein the switching portion comprises a plurality of switching members, the plurality of switching members being arranged in a circumferential direction of the rotating shaft,
wherein the circuit board is formed with a through-hole having a circular shape and penetrating the circuit board in the axial direction, the through-hole having a diameter that is larger than a diameter of the rotor.

\* \* \* \* \*